(12) United States Patent
Zhu et al.

(10) Patent No.: US 9,955,257 B2
(45) Date of Patent: Apr. 24, 2018

(54) CLASS-D AUDIO AMPLIFIER

(71) Applicant: Silergy Semiconductor Technology (Hangzhou) Ltd., Hangzhou (CN)

(72) Inventors: Huaping Zhu, Hangzhou (CN); Hejinsheng Cao, Hangzhou (CN); Qichang Wu, Hangzhou (CN); Zhenguo Sun, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 0 days.

(21) Appl. No.: 15/240,341

(22) Filed: Aug. 18, 2016

(65) Prior Publication Data

US 2017/0054416 A1 Feb. 23, 2017

(30) Foreign Application Priority Data

Aug. 18, 2015 (CN) .......................... 2015 1 0508463

(51) Int. Cl.
*H03F 3/38* (2006.01)
*H04R 3/02* (2006.01)
(Continued)

(52) U.S. Cl.
CPC .............. *H04R 3/02* (2013.01); *H03F 1/305* (2013.01); *H03F 1/342* (2013.01); *H03F 3/185* (2013.01); *H03F 3/187* (2013.01); *H03F 3/213* (2013.01); *H03F 3/2173* (2013.01); *H03F 3/45475* (2013.01); *H03G 3/348* (2013.01); *H03F 3/217* (2013.01); *H03F 3/2171* (2013.01);
(Continued)

(58) Field of Classification Search
CPC ...... H03F 3/217; H03F 3/2171; H03F 3/2173; H03F 3/38; H03F 2200/432
USPC .................................................. 330/10, 251
See application file for complete search history.

(56) References Cited

U.S. PATENT DOCUMENTS 8,854,132 B2 * 10/2014 Lesso .................... H03F 3/2173
330/251
2013/0003988 A1 1/2013 Huang
(Continued)

FOREIGN PATENT DOCUMENTS

CN 101958690 A 1/2011
CN 103199800 A 7/2013
(Continued)

OTHER PUBLICATIONS

Office Action from Chinese Patent Application No. 201510508463.3, dated Jun. 28, 2017, 12 pages.

*Primary Examiner* — Khanh V Nguyen
(74) *Attorney, Agent, or Firm* — Westman, Champlin & Koehler, P.A.

(57) ABSTRACT

The present disclosure relates to a class-D audio amplifier. When the class-D audio amplifier is powered on, an auxiliary power amplifier and an auxiliary feedback circuit constitute an auxiliary close loop so that a control loop is established in advance. The auxiliary close loop is disconnected after various circuit modules reach their steady operation points, and the class-D audio amplifier operates at a normal state. A soft start circuit is provided for suppressing noise which occurs when the class-D audio amplifier is powered on. Thus, the class-D audio amplifier suppresses POP noise at an output terminal when the class-D audio amplifier is powered on.

12 Claims, 4 Drawing Sheets

(51) Int. Cl.
  *H03F 3/187* (2006.01)
  *H03F 3/213* (2006.01)
  *H03F 1/34* (2006.01)
  *H03F 1/30* (2006.01)
  *H03F 3/185* (2006.01)
  *H03F 3/45* (2006.01)
  *H03G 3/34* (2006.01)
  *H03F 3/217* (2006.01)

(52) U.S. Cl.
  CPC ............ *H03F 3/38* (2013.01); *H03F 2200/03* (2013.01); *H03F 2200/351* (2013.01); *H03F 2200/432* (2013.01); *H03F 2203/45512* (2013.01); *H03F 2203/45528* (2013.01); *H03F 2203/45534* (2013.01); *H03F 2203/45536* (2013.01); *H03F 2203/45594* (2013.01); *H03F 2203/45631* (2013.01); *H03F 2203/45634* (2013.01); *H03F 2203/45702* (2013.01); *H04R 2430/01* (2013.01)

(56) References Cited

U.S. PATENT DOCUMENTS

2013/0154736 A1* 6/2013 Jiang .................... H03F 3/217
                                                              330/251
2016/0212556 A1   7/2016 Cao

FOREIGN PATENT DOCUMENTS

| CN | 103501162 A | 1/2014 |
| CN | 104104343 A | 10/2014 |
| CN | 104201997 A | 12/2014 |
| CN | 104639070 A | 5/2015 |
| CN | 104640053 A | 5/2015 |

* cited by examiner

CLASS-D AUDIO AMPLIFIER

CROSS-REFERENCE TO RELATED APPLICATION

This application claims the benefit of Chinese Patent Application No. 201510508463.3, filed on Aug. 18, 2015, which is incorporated herein by reference in its entirety.

BACKGROUND OF THE DISCLOSURE

Field of the Disclosure

The present disclosure relates to the field of power electronics, and more particularly, to a class-D audio amplifier.

Background of the Disclosure

A class-D audio amplifier is widely used in portable electronic devices, such as PDA, mobile phone, MP3, and the like, because its advantages of high affiance, low power consumption.

The conventional class-D audio amplifier typically introduces POP noise which is pop-like sound caused by transient impact of various operations after an audio system is powered on, powered off or operates in a steady state. The transient impact which causes POP noise is typically a narrow spike pulse. After Fourier expansion, it has complex spectral components, with energy distribution relatively uniform in a frequency domain. The POP noise is an important characteristic parameter in an audio system, and required to reach a higher and higher level by a client.

The class-D audio amplifier has two output configurations: a full-bridge output configuration and a one-end output configuration. The class-D audio amplifier with a full-bridge configuration has a positive terminal and a negative terminal, as differential output terminals. The impact pulses with the same amplitude will occur at the two terminals, cancel out each other after passing through a load. The impact pulses will not act on a speaker, and thus the class-D audio amplifier avoids the POP-like noise. Compared with one-end configuration, the class-D audio amplifier with a full-bridge configuration has improved capacity of suppressing common noise. Even so, the class-D audio amplifier with a full-bridge configuration still has POP noise to some extent.

In the prior art, the class-D audio amplifier performs timing control for suppressing POP noise. Various circuit modules of the class-D audio amplifier are activated to provide an output after their operation points have been established. The outputs of various modules will be activated in sequence to avoid undesirable noise. However, the noise and the imbalance cannot be eliminated due to limitations of the process and design. When the input voltage is a zero voltage, the output voltage still introduces a noise component and a bias voltage, and thus suffers from POP noise.

SUMMARY OF THE DISCLOSURE

In view of this, the present disclosure provides a class-D audio amplifier to solve the problem of large POP noise when the class-D audio amplifier is powered on.

According to one aspect of the present disclosure, there is provided a class-D audio amplifier, comprising:

a loop filter configured to receive filter an audio signal and provide a first audio signal;

a PWM modulation circuit being electrically coupled to the loop filter, and configured to receive the first audio signal and compare the first audio signal with a triangular wave signal and provide an audio PWM signal;

a power amplifier being electrically coupled to the PWM modulation circuit, and configured to receive and amplify power of the audio PWM signal and provide an output voltage;

an auxiliary power amplifier configured to start its operate when the class-D audio amplifier is powered on and stop its operation after the class-D audio amplifier is powered off; and a soft start circuit configured to suppress noise interference from a control loop when the class-D audio amplifier is powered on, wherein an output voltage of the power amplifier is not fed back to an input terminal of the loop filter, or the power amplifier is disabled, when the auxiliary power amplifier is active.

Preferably, the class-D audio amplifier further comprises an auxiliary feedback circuit which connects the auxiliary power amplifier to or disconnects the auxiliary power amplifier from the class-D audio amplifier.

Preferably, the auxiliary power amplifier is connected between an input terminal and an output terminal of the loop filter through the auxiliary feedback circuit.

Preferably, the auxiliary power amplifier comprises:

a first comparison circuit configured to receive the first audio signal and compare the first audio signal with a triangular wave signal and provide an auxiliary audio PWM signal;

a first driving circuit being electrically coupled to the comparison circuit and configured to convert the auxiliary audio PWM signal into an auxiliary driving signal of a transistor, a first power stage circuit configured to operate in accordance with the auxiliary driving signal.

Preferably, the power amplifier comprises:

a second driving circuit configured to receive and convert the audio PWM signal from the PWM modulation circuit into a driving signal of a transistor, and a second power stage circuit configured to generate the output voltage in accordance with the driving signal.

Preferably, the soft start circuit is connected between the loop filter and the PWM modulation circuit, the soft start circuit starts to operate before the power amplifier is enabled, and stops operating when an input voltage is equal to an output voltage.

Preferably, the soft start circuit comprises:

a fifth switch being connected in parallel between the first output terminal and the second output terminal, a fifth resistor being connected between the first output terminal and the second output terminal;

a sixth switch having a first terminal being connected to the first output terminal of the soft start circuit, and a second terminal connected to a first terminal of a third capacitor, and a second terminal of the third capacitor is connected to a ground;

a sixth resistor being connected between a second input terminal and the second output terminal of the soft start circuit;

a seventh switch having a first terminal being connected to the second output terminal of the soft start circuit, and a second terminal connected to a first terminal of a fourth capacitor, and a second terminal of the fourth capacitor is connected to a ground, wherein the fifth switch is turned on when the power amplifier is enabled, and is turned off after having been turned on for a first predetermined time period, so that the class-D audio amplifier has an original output voltage equal to zero, the sixth and the seventh switches are turned on when the class-D audio amplifier is powered on, and are turned off when an input voltage is equal to an output voltage, Preferably, the feedback circuit is turned on when a second predetermined time period elapses after the soft start circuit stops its operation.

Preferably, the power amplifier is enabled by a first enable signal, and the auxiliary power amplifier is enabled by a second enable signal.

Preferably, the auxiliary power amplifier is connected between an input terminal of the loop filter and an output terminal for the PWM modulation circuit.

Preferably, the soft start circuit is disposed between the power amplifier and an output terminal of the class-D audio amplifier, the soft start circuit starts to operate when the class-D audio amplifier is powered on, and stops operating when the auxiliary power amplifier stops operating in the class-D audio amplifier.

Preferably, the soft start circuit clamps the output voltage to be a predetermined value during operation.

The present disclosure introduces an auxiliary power amplifier and an auxiliary feedback circuit in a class-D audio amplifier. When the class-D audio amplifier is powered on, an auxiliary power amplifier and an auxiliary feedback circuit constitute an auxiliary close loop so that a control loop is established in advance. The auxiliary close loop is disconnected after various circuit modules reach their steady operation points, and the class-D audio amplifier operates at a normal state. A soft start circuit is provided for suppressing noise which occurs when the class-D audio amplifier is powered on. Thus, the class-D audio amplifier suppresses POP noise at an output terminal when the class-D audio amplifier is powered on. The present disclosure avoids noise which is caused by noise accumulated in the filter circuit and a bias voltage when the class-D audio amplifier is powered on in an open loop. Moreover, the auxiliary power amplifier and the auxiliary feedback circuit can substantially suppress an effect of the noise in a control loop and a bias voltage on the output terminal. Thus, the POP noise at the output terminal is greatly reduced when the class-D audio amplifier is powered on.

According to an embodiment of the present disclosure, when the class-D audio amplifier is powered on, the auxiliary power amplifier and the auxiliary feedback circuit constitute an auxiliary close loop so that a control loop is established firstly. Meanwhile, the auxiliary power amplifier provides an output signal which is only fed back but not supplied to an output terminal. Thus, in the process of establishing the control loop, there will be no POP noise at the output terminal of the class-D audio amplifier. After establishing the control loop, the power amplifier is enabled to provide an output, and the auxiliary close loop stop operating in the class-D audio amplifier. In such manner, the soft start circuit is used for preventing the POP noise from being supplied to the output terminal so that there is no POP noise at the output terminal of the class-D audio amplifier when the class-D audio amplifier is powered on.

BRIEF DESCRIPTION OF THE DRAWINGS

Those technical solutions according to embodiments of the present disclosure and the prior art will be apparent when they are described in connection with appended drawings which are firstly described briefly hereinbelow. It will be obvious to one skilled in the art that the following appended drawings show only some embodiments of the present disclosure. Other appended drawings can be obtained from these appended drawings without the need for creative work.

DETAILED DESCRIPTION OF THE DISCLOSURE

Reference will now be made in detail to particular embodiments of the disclosure, it will be understood that the scope of the present invention is not limited to these embodiments. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, and circuits have not been described in detail so as not to unnecessarily obscure aspects of the present invention.

Furthermore, it will be understood by one skilled in the art that attached drawings are to be regraded as illustrative, and may not be drawn to scale.

Also, it will be understood in the following description that the term "circuit" refers to a conductive loop consisting of at least one component or sub-circuit which are electrically coupled or electromagnetically coupled to each other. When one component/circuit is referred to as being "connected to" another component, or one component/circuit is referred to as being "connected between" two nodes, it can be connected to or coupled to another component directly or with an intermediate component therebetween. The connection of two components can be physical or logical connection, or physical and logical connection. On the contrary, when one component is referred to as being "coupled directly to" or "connected directly to" another component, there will be no an intermediate component between two components.

Where the term "comprising" or "including" is used in the present description and claims, it does not exclude other elements or steps, unless something otherwise is specifically stated. That is, it means "including, but not limited to".

In the following description that the terms such as "first", "second" and the like are used herein for purposes of description and are not intended to indicate or imply relative importance or significance. The term "plurality", as used herein, is defined as two or more than two, unless something otherwise is specifically stated.

Figure 1:
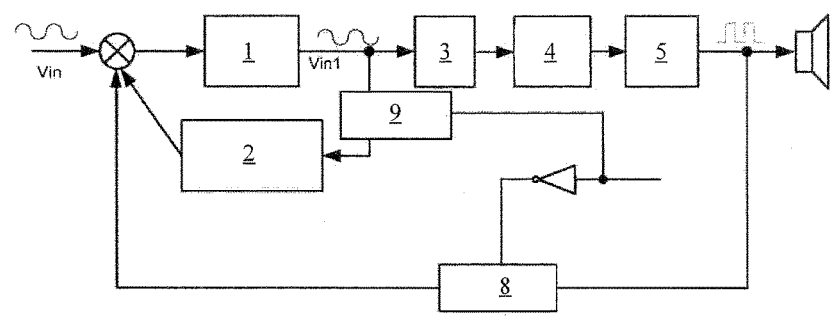
FIG. 1 is a structural diagram of an example class-D audio amplifier according to a first embodiment of the present disclosure.

FIG. 1 is a structural diagram of an example class-D audio amplifier according to a first embodiment of the present disclosure. As shown in FIG. 1, the class-D audio amplifier according to the first embodiment of the present disclosure includes a loop filter 1, a PWM modulation circuit 4, a power amplifier 5, a feedback circuit 8, an auxiliary power amplifier 2, an auxiliary feedback circuit 9, and a soft start circuit 3.

The loop filter 1 receives an audio signal Vin at an input terminal, filters the audio signal Vin, and provides a first audio signal Vin1.

The PWM modulation circuit 4 is electrically coupled to the loop filter 1, receives the first audio signal Vin1, compares the first audio signal Vin1 with a triangular wave signal, and provides an audio PWM signal. The audio PWM signal is a digitalized signal of the input audio signal Vin, for representing an amplitude of the input audio signal.

The power amplifier 5 is electrically coupled to the PWM modulation circuit 4, receives the audio PWM signal, amplifies power of the audio PWM signal, and provide an output voltage. The output voltage is used for driving a load, such as a speaker.

The feedback circuit 8 is connected between an output terminal of the class-D audio amplifier and an input terminal of the loop filter 1. After the circuit is powered on and the output voltage is stable, the output voltage is fed back to the input terminal of the loop filter 1, as a negative feedback signal of the input audio signal Vin. The output voltage of the class-D audio amplifier is maintained constant by a control loop to satisfy requirements of the load such as a speaker.

In the embodiment according to the present disclosure, the auxiliary power amplifier 2 is connected between an input terminal and output terminal of the loop filter 1 through an auxiliary feedback circuit 9, and the auxiliary feedback circuit 9 is connected between an input terminal of the auxiliary power amplifier 2 and the output terminal of the filter loop 101, for feeding back an output signal of the auxiliary power amplifier 2 to the input terminal of the loop filter 1. Moreover, the auxiliary power amplifier 2 has the same circuit configuration as that of the power amplifier 5, with parameters of electronic components in the auxiliary power amplifier 2 the same as those in the power amplifier 5. The auxiliary power amplifier 2 is used for establishing a stable control loop when the class-D audio amplifier is powered on, during which the auxiliary feedback circuit 9 is active and the power amplifier 5 is disabled.

In an embodiment according to the present disclosure, a pair of complementary control signals may be used for controlling the feedback circuit 8 and the auxiliary feedback circuit 9, so that the two circuits are actuated in a complementary manner, but not simultaneously. Consequently, an output voltage of the power amplifier 5 is not fed back to the loop filter 1, when the auxiliary power amplifier 2 feeds back an output voltage to the loop filter 1

As a comparison, various circuit modules in the previous stages must start to operate before the output terminal of the class-D audio amplifier is enabled in the prior art, due to the requirement of timing control. A conventional approach is to establish operation points of various circuit modules in an open loop. After various circuit modules start to operate, the output terminal is then enabled and the class-D audio amplifier operates in a close loop. There is inconsistence between operation points in an open loop and those in a close loop. An "correction" operation is introduced after the output terminal is enabled, which is an additional source of POP noise. Moreover, the loop filter 1 of the class-D audio amplifier in a close loop typically consists of an integration circuit. The inconsistence in the class-D audio amplifier will be accumulated and amplified, so that POP noise at the output terminal will be increased.

In the embodiment according to the present disclosure, an auxiliary close loop including the auxiliary power amplifier 2 and the auxiliary feedback circuit 9 is used for establishing steady operation points of the circuit modules in the control loop of the class-D audio amplifier. Before the output terminal is enabled, the control loop is a close loop. Thus, the operation points of the circuit modules in the class-D audio amplifier will be unchanged, before and after the output terminal is enabled. No "correction" operation is needed. Meanwhile, the auxiliary close loop has an effect of suppressing noise in the loop. The noise of the input stage will not be accumulated and amplified due to the existence of the integration circuit. Energy of the POP noise is thus limited.

Moreover, the soft start circuit 3 suppresses noise interference from a control loop when the class-D audio amplifier is powered on. In the present embodiment, the soft start circuit 3 is connected between the loop filter 1 and the PWM modulation circuit 4.

It is apparent from the above analysis that the auxiliary close loop is activated when the class-D audio amplifier is powered on, which suppresses energy of the POP noise at the output terminal, but will not eliminate it. If energy of the POP noise is high in the control loop after the power amplifier is enabled, a human ear still can hear noise. Thus, a soft start circuit is introduced to provide a soft-start function. On one hand, the soft start circuit 3 operates before the output terminal is enabled, which shorts the first audio signal. No signal is supplied to the PWM modulation circuit 4, and the output signal in an initial state is zero. On the other hand, the soft start circuit 3 operates after the output terminal is enabled, which buffers the first audio signal having relatively high noise interference, so that energy of the POP noise increases slowly. It is equivalent to the case that energy of the POP noise is distributed in time domain. Consequently, energy of the POP noise decreases to a value less than that can be heard by a human ear, so that an effect of the POP noise in the class-D audio amplifier can be eliminated.

The auxiliary power amplifier 2 starts to operate after the class-D audio amplifier is powered on, and stops operating in the class-D audio amplifier when the soft start circuit 3 ensures a stable output voltage. The power amplifier 5 is disabled when the auxiliary power amplifier 2 operates. Therefore, the embodiment according to the present disclosure introduces the auxiliary power amplifier 2 and the auxiliary feedback circuit 9 to establish steady operation points of the circuit modules before the output terminal of the class-D audio amplifier is enabled, so that the POP noise at the output terminal when the class-D audio amplifier is powered on is suppressed. The present disclosure avoids noise which is caused by noise accumulated in the filter circuit and a bias voltage when the class-D audio amplifier is powered on in an open loop. Moreover, the auxiliary power amplifier and the auxiliary feedback circuit can substantially suppress an effect of the noise in a control loop and a bias voltage on the output terminal. Thus, the POP noise at the output terminal is greatly reduced when the class-D audio amplifier is powered on.

Figure 2:
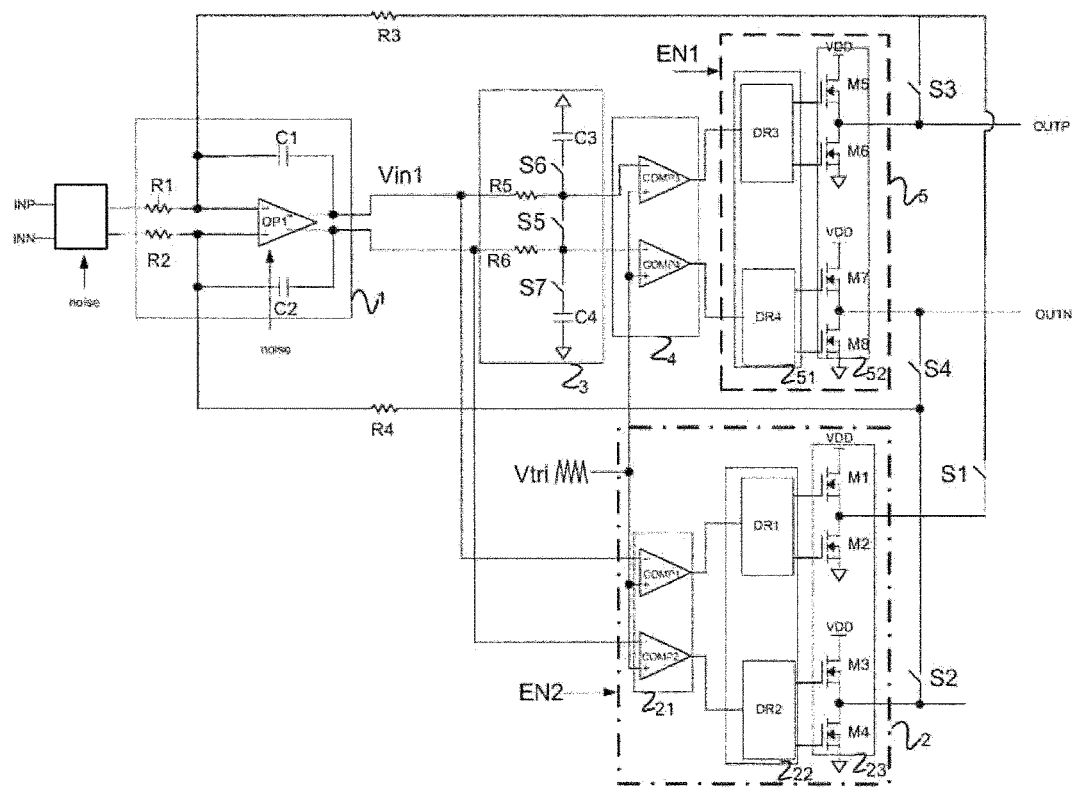
FIG. 2 is a schematic circuit diagram of an example class-D audio amplifier according to the first embodiment of the present disclosure.

FIG. 2 is a schematic circuit diagram of an example class-D audio amplifier according to the first embodiment of the present disclosure. To explain an operating principle and beneficial effects according to the embodiment of the present disclosure, FIG. 2 illustrates schematic circuit diagrams in each block of the class-D audio amplifier. As shown in FIG. 2, the class-D audio amplifier according to the first embodiment of the present disclosure is explained as having a full-bridge configuration, including a loop filter 1, a PWM modulation circuit 4, a power amplifier 5, a feedback circuit 8, an auxiliary power amplifier 2, and an auxiliary feedback circuit 9, and a soft start circuit 3. Each circuit module has the same function as that shown in FIG. 1. The circuit configuration of each circuit module and its operating principle will be described in detail below.

The loop filter 1 consists of an integration circuit, including an operational amplifier OP1, capacitor C1 and C2, input resistors R1 and R2. The capacitors C1 and C2 are connected between an input terminal and an output terminal of the operational amplifier OP1. A positive component and a negative component of the audio signal Vin are received at two input terminals of the operational amplifier OP1 through the input resistors R1 and R2, respectively. An output terminal of the operational amplifier OP1 provides the first audio signal Vin1.

The auxiliary power amplifier 2 is connected in parallel between an input terminal and an output terminal of the loop filter 1 through the auxiliary feedback circuit 9 which consists of a switch S1, a resistor R3, a switch S2 and a resistor R4. The auxiliary power amplifier 2 comprises several circuit modules.

A first comparison circuit 21 receives the first audio signal Vin1, compares the first audio signal Vin 1 with a triangular wave signal Vtri, and provides an auxiliary audio PWM signal. The first comparison circuit 21 consists of a first comparator COMP1 and a second comparator COMP2, each of which has a first input terminal for receiving the first audio signal Vin1 and a second input terminal for receiving the triangular wave signal Vtri. The first comparator COMP1 and the second comparator COMP2 output a positive auxiliary audio PWM signal and a negative auxiliary audio PWM signal after comparison, respectively.

The first driving circuit 22 is connected to the comparison circuit, converts the auxiliary audio PWM signal into an auxiliary driving signal which satisfies requirement for driving transistors in a subsequent power stage circuit, i.e. a positive auxiliary driving signal and a negative auxiliary driving signal. The first driving circuit 22 includes a first driver DR1 and a second driver DR2. The positive auxiliary driving signal and the negative auxiliary driving signal are a pair of complementary signals.

A first power stage circuit 23 operates in accordance with the auxiliary driving signal. The first power stage circuit 23 includes a first half-bridge switching circuit and a second half-bridge switching circuit which output the first voltage and the second voltage respectively, for preventing an output voltage of the power amplifier 5 from being feeding back to the loop filter 1. Thus, the class-D audio amplifier operates in a close loop. In an embodiment according to the present disclosure, the first half-bridge switching circuit consists of transistors M1 and M2. The transistor M1 has a first terminal connected to a power supply terminal VDD, and a second terminal connected to ground through the transistor M2. An intermediate node between the transistors M1 and M2 provides a first voltage. The second half-bridge switching circuit consists of transistors M3 and M4. The transistor M3 has a first terminal connected to a power supply terminal VDD, and a second terminal connected to ground through the transistor M4. An intermediate node between the transistors M3 and M4 provides a second voltage.

The soft start circuit 3 suppresses noise interference from a control loop when the class-D audio amplifier is powered on. In the present embodiment, the soft start circuit 3 is connected between the loop filter 1 and the PWM modulation circuit 4. The soft start circuit 3 includes several circuit modules.

A fifth switch S5 is connected in parallel between the first output terminal and the second output terminal of the soft start circuit 3.

A fifth resistor R5 is connected between a first input terminal and the first output terminal of the soft start circuit 3.

A sixth switch S6 has a first terminal being connected to the first output terminal of the soft start circuit, and a second terminal connected to a first terminal of a third capacitor C3, and a second terminal of the third capacitor is connected to a ground. When the sixth switch is turned on, the fifth resistor R5 and the third capacitor C3 constitute a first RC filter circuit.

A sixth resistor R6 is connected between a second input terminal and the second output terminal of the soft start circuit.

A seventh switch S7 has a first terminal being connected to the second output terminal of the soft start circuit, and a second terminal connected to a first terminal of a fourth capacitor C4, and a second terminal of the fourth capacitor C4 is connected to a ground. When the seventh switch S7 is turned on, the sixth resistor R6 and the fourth capacitor C4 constitute a second RC filter circuit.

When the fifth switch S5 is turned on, the positive signal and the negative signal of the first audio signal Vin1 is shorten so that the no signal is provide to the subsequent PWM modulation circuit 4. When the fifth switch S5 is turned off and the sixth switch S6 and seventh switch S7 is turned on, the positive signal and the negative signal of the first audio signal Vin1 are filtered by the first RC filter circuit and the second RC filter circuit respectively. An interference pulse with a large amplitude in the positive signal and the negative signal of the first audio signal Vin1 is smoothed. It is equivalent to the case that energy of the POP noise is distributed in time domain. Consequently, the interference pulse with a large amplitude will not cause the POP noise that can be heard by a human ear at the output terminal.

The PWM modulation circuit 4 is connected to the soft start circuit 3. The PWM modulation circuit 4 consists of a second comparison circuit which compares the first audio signal Vin1, directly or after being buffered by the soft start circuit 3, with a triangular wave signal Vtri, and converts it into an audio PWM signal. The second comparison circuit consists of a third comparator COMP3 and a fourth comparator COMP4, each of which has a first input terminal for receiving the first audio signal Vin1, directly or after being buffered by the soft start circuit 3, and a second input terminal for receiving the triangular wave signal Vtri. The third comparator COMP3 and the fourth comparator COMP4 output a positive auxiliary audio PWM signal and a negative auxiliary audio PWM signal after comparison, respectively.

It should be understood that the PWM modulation circuit 4 and the first comparison circuit 21 have the same circuit configuration, and receives the same signal in some time periods, but have different functions in the class-D audio amplifier and operate in different time periods. The first comparison circuit 21 is used for generating an auxiliary audio PWM signal in the auxiliary close loop when the class-D audio amplifier is powered on. A first voltage and a second voltage are generated in accordance with the auxiliary audio PWM signal, but are not supplied to the output terminals OUTP and OUTN of the class-D audio amplifier. The PWM modulation circuit 4 is provided at the path of the power stage of the class-D audio amplifier. The PWM modulation circuit 4 provides the audio PWM signal to the output terminals, as an output voltage of the class-D audio amplifier.

The power amplifier 5 is connected to the PWM modulation circuit 4 as a subsequent stage. An output voltage of the power amplifier 5 is fed back to the input terminal of loop filter 1 through the feedback circuit consisting of the switch S3, the resistor R3, the switch S4 and the resistor R4.

The power amplifier 5 is used for amplifying the audio PWM signal and providing an output voltage of the class-D audio amplifier. The power amplifier 5 includes a second driving circuit 51 and a second power stage circuit 52 having the same circuit configurations and functions as those of the first driving circuit 22 and the first power stage circuit 53, with parameters of electronic components in the power amplifier 5 as those of the first driving circuit 22 and the first power stage circuit 53.

Specifically, the second driving circuit 51 includes a third driver DR3 and a fourth driver DR4, which receive the positive audio PWM signal and the negative audio PWM signal from the PWM modulation circuit 4 respectively, and provide a pair of complementary driving signals respectively. The second power stage circuit 52 operates in accordance with the driving signal. The second power stage circuit 52 includes a third half-bridge switching circuit and a fourth half-bridge switching circuit which output the positive output voltage OUTP and the negative output voltage OUTN respectively. In an embodiment according to the present disclosure, the third half-bridge switching circuit consists of transistors M5 and M6. The transistor M5 has a first terminal connected to a power supply terminal VDD, and a second terminal connected to ground through the transistor M6. An intermediate node between the transistors M5 and M6 provides the positive output voltage OUTP. The fourth half-bridge switching circuit consists of transistors M7 and M8. The transistor M7 has a first terminal connected to a power supply terminal VDD, and a second terminal connected to ground through the transistor M8. An intermediate node between the transistors M7 and M8 provides the negative output voltage OUTN. An amplitude of an differential signal between the positive output voltage OUTP and the negative output voltage OUTN is a voltage applied to a load such as a speaker.

Figure 3:
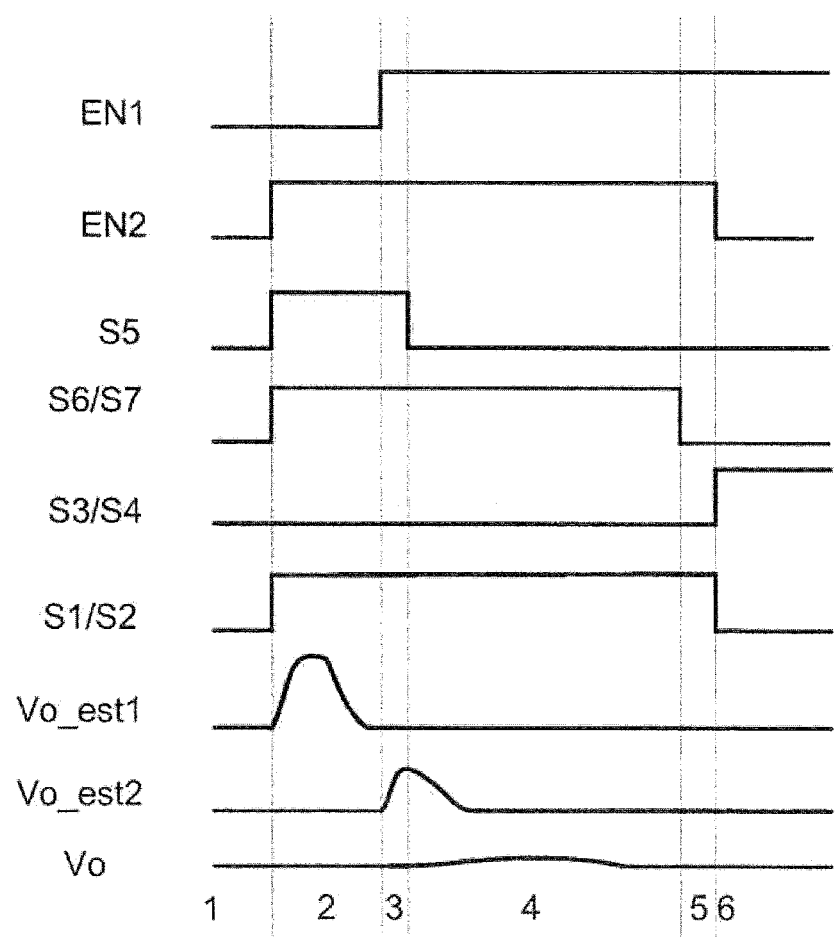
FIG. 3 is an operation waveform diagram of an example class-D audio amplifier according to the first embodiment of the present disclosure.

FIG. 3 is an operation waveform diagram of an example class-D audio amplifier according to the first embodiment of the present disclosure. The class-D audio amplifier will be described in detail to explain the operating principle and process of the present disclosure.

In FIG. 3, the first enable signal EN1 is the one for the power amplifier 5, i.e. an output enable signal; the second enable signal EN2 is the one for the auxiliary power amplifier 2, i.e. an auxiliary feedback enable signal, which enables the auxiliary amplifier and the auxiliary feedback circuit simultaneously in this embodiment; S5, S6, and S7 are control signals for respective ones of the switches in the soft start circuit 3; S1 and S2 are control signals for respective ones of the switches in the auxiliary feedback circuit; S3 and S4 are control signals for respective ones of the switches in the output feedback circuit; Vo is a waveform of the output voltage, i.e. a differential signal between the positive output voltage OUTP and the negative output voltage OUTN.

It should be understood that waveforms of a simulated output voltage Vo_est1 and a simulated output voltage Vo_est2 are also shown as a comparison in FIG. 3, for explaining beneficial effects of the embodiments according to the present disclosure. The simulated output voltage Vo_est1 is obtained from a circuit without an auxiliary power amplifier, an auxiliary feedback circuit, and a soft start circuit. The simulated output voltage Vo_est2 is obtained from a circuit with an auxiliary power amplifier and an auxiliary feedback circuit, but without a soft start circuit.

The class-D audio amplifier operates in the following sequence.

At a first stage, the class-D audio amplifier is powered on, for supplying electric energy to various circuit modules.

At a second stage, the second enable signal EN2 is valid, and the control signals S1 and S2 are valid, so that the auxiliary power amplifier 2 and the auxiliary feedback circuit starts to operate. Preferably, when the stage begins, the switches S5, S6 and S7 are turned so that the first input audio signal Vin1 is shorten so that no signal is supplied to the class-D audio amplifier. The class-D audio amplifier has an input voltage and an output voltage which are both zero voltages, before the power amplifier 5 is enabled. In a conventional approach, an output terminal of the class-D audio amplifier is enabled at the time point, where no an auxiliary close loop and no a soft start circuit are introduced. Interference noise with a high voltage amplitude occurs in a case that the input voltage is a zero voltage, as shown in the waveforms of a simulated output voltage Vo_est1.

At the third stage, the auxiliary close loop consisting of the auxiliary power amplifier 2 and the auxiliary feedback circuit render the class-D audio amplifier loop to operate in a steady state. Meanwhile, the class-D audio amplifier output is enabled. That is, the first enable signal EN1 is valid so that the power amplifier 5 starts to operate. The class-D audio amplifier operates in an open loop. Due to the function of the soft start circuit, the output voltage is near a zero voltage. In a conventional approach, if there is no soft start circuit, interference noise with a high voltage amplitude occurs as shown in the waveforms of a simulated output voltage Vo_est2.

At the fourth stage, the switch S5 in the soft start circuit 3 is turned off. The fifth resistor R5 and the third capacitor C3 constitute a first RC filter circuit, and the sixth resistor R6 and the fourth capacitor C4 constitute a second RC filter circuit. Both the first RC filter circuit and the second RC filter circuit are enabled. The soft start circuit receives and filters the first input audio signal. That is, it establishes a noise voltage slowly. Differential voltage of the output voltage is established slowly when the output voltage of the soft start circuit reaches the input voltage from a zero voltage slowly. It is equivalent to the case that energy of noise is distributed in time domain. The peak value of the output voltage decreases to a value less than that can be heard by a human ear. Thus, the POP noise at the output terminal is well suppressed.

At the fifth stage, the output voltage of the soft start circuit 3 is equal to an input voltage. The soft start stage ends. The switches S6 and S7 are both turned off so that the soft start circuit 3 has no effect on a normal control loop. That is, the soft start circuit stops operating in the class-D audio amplifier.

At the sixth stage, the second enable signal EN2 is invalid, and the switches S1 and S2 are turned off so that the auxiliary close loop stops operating in the class-D audio amplifier, and the switches S3 and S4 are turned on so that the output voltage of the class-D audio amplifier is fed back to the input terminal of the loop filter through the feedback circuit. The two power amplifiers have the same parameters of electronic components, and can be switched from one to the other smoothly, without fluctuations caused in the class-D audio amplifier. The start stage ends. When a second predetermined time period (i.e. the time period during which the fifth stage occurs) elapses, after the soft start circuit stops operating, the output voltage is fed back to the input terminal of the loop filter through the feedback circuit. This is for the purpose that the output voltage is fed back to the input terminal of the loop filter when the voltage in the loop is stable after the soft start circuit stop operating.

It is apparent from the above analysis that the embodiment according to the present disclosure introduces an auxiliary close loop for limiting energy of the POP noise being output from the class-D audio amplifier when the class-D audio amplifier is powered on, and introduces a soft start circuit for establishing energy of the POP noise slowly so that energy of the noise voltage is less than a value that can be heard by a human ear, so that the POP noise is eliminated in the class-D audio amplifier.

Figure 4:
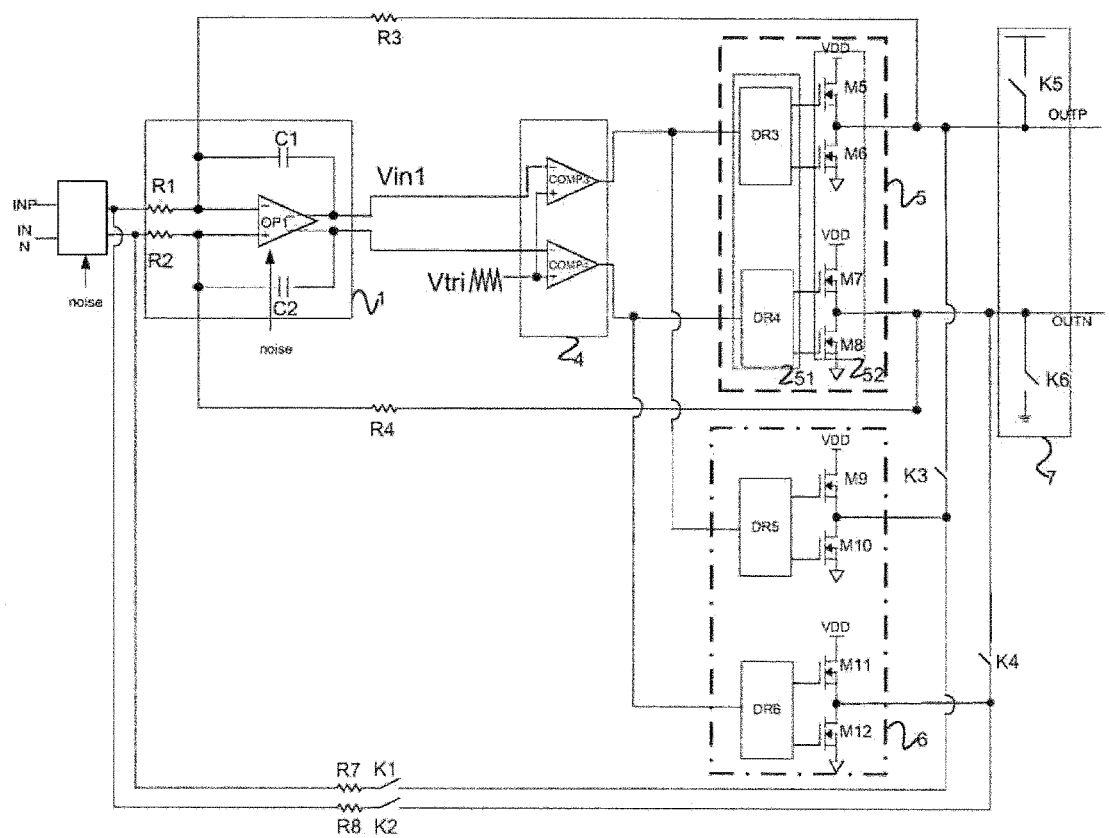
FIG. 4 is a schematic circuit diagram of an example class-D audio amplifier according to the second embodiment of the present disclosure.

FIG. 4 is a schematic circuit diagram of an example class-D audio amplifier according to the second embodiment of the present disclosure. As shown in FIG. 4, the class-D audio amplifier according to the second embodiment of the present disclosure includes a loop filter 1, a PWM modulation circuit 4, a power amplifier 5, an auxiliary power amplifier 6, a soft start circuit 7, a feedback circuit 8, and auxiliary feedback circuit 9. The loop filter 1, the PWM modulation circuit 4 and the power amplifier 5 have structures the same as those in the class-D audio amplifier according to the first embodiment, and detailed description of which is omitted.

The auxiliary power amplifier 6 is connected between an input terminal of the loop filter 1 and an output terminal of the PWM modulation circuit 4 through the auxiliary feedback circuit 9 which consists of a switch K1, a resistor R7, a switch K2 and a resistor R8. Alternately, the auxiliary power amplifier 6 is connected to a feedback circuit consisting of the resistor R3 and the resistor R4 and the output terminal of the class-D audio amplifier through the switches K3 and K4. The feedback circuit is always connected to the output terminal of class-D audio amplifier, so that an output signal of the auxiliary power amplifier 6 is fed back to the input terminal of the loop filter 1. The auxiliary power amplifier 6 has the same circuit configuration as that of the power amplifier 5, with parameters of electronic components in the auxiliary power amplifier 6 the same as those in the power amplifier 5.

Therefore, compared with the first embodiment, the class-D audio amplifier according to the second embodiment has an auxiliary power amplifier 6 at an output terminal of the PWM modulation circuit 4, so that the auxiliary power amplifier 6 can have no a comparison circuit for generating an audio PWM signal, which reduces circuit cost and decreases a size of the integrated circuit.

In the present embodiment, the soft start circuit 7 is disposed at the output terminal of the class-D audio amplifier. There are a switch K5 with a first terminal for receiving a predetermined voltage, and a second terminal being connected to a positive output terminal of the class-D audio amplifier, and a switch K6 with a first terminal being connected to ground and a second terminal being connected to a negative output terminal of the class-D audio amplifier. When the soft start circuit 7 operates, the switches K5 and K6 are turned on. The soft start circuit 7 starts to operate when the class-D audio amplifier is powered on, and stops operating when the auxiliary power amplifier 6 stops operating in the class-D audio amplifier. The soft start circuit 7 is introduced so that the output terminal of the class-D audio amplifier is applied with a predetermined voltage when the class-D audio amplifier is power on. Preferably, the predetermined voltage has a value equal to a desired value of the output voltage of the class-D audio amplifier, so as to avoid the noise energy in the control loop when the class-D audio amplifier is powered on to be supplied to the output terminal to cause a high POP noise which can be heard by a human ear. That is, the output voltage of the class-D audio amplifier at a start stage is clamped to the predetermined voltage.

Figure 5:
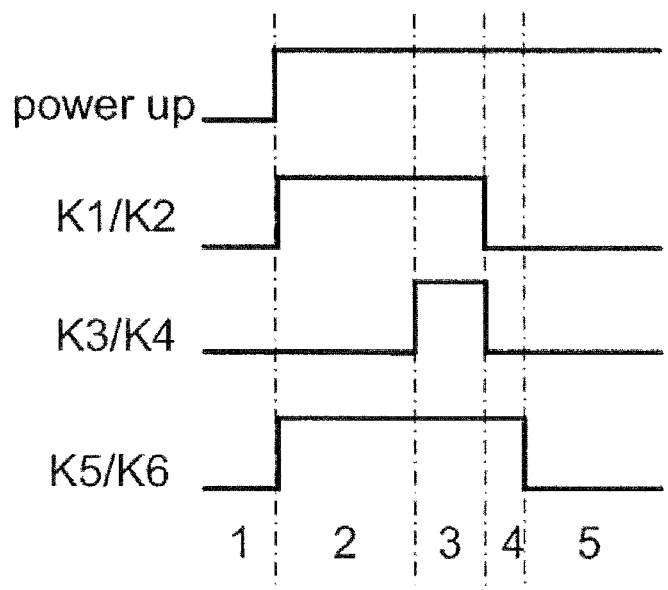
FIG. 5 is an operation waveform diagram of an example class-D audio amplifier according to the second embodiment of the present disclosure.

FIG. 5 is an operation waveform diagram of an example class-D audio amplifier according to the second embodiment of the present disclosure. The class-D audio amplifier will be described in detail to explain the operating principle and process of the present embodiment.

In FIG. 5, the signal power up is a power on signal, which is valid at a high level and indicates that the class-D audio amplifier power is enabled, the signals K1~K6 are control signals of respective ones of the switches in the circuit diagram.

The class-D audio amplifier operates in the following sequence.

At a first stage, the class-D audio amplifier is prepared for power on.

At a second stage, the class-D audio amplifier is powered on, for supplying electric energy to various circuit modules. At the time period, the auxiliary power amplifier 6 starts to operate, the switches K1 and K2 are turned on so that the auxiliary feedback circuit is activated for feeding back an output signal of the auxiliary power amplifier 6 to an input terminal of the loop filter 1. A stable control loop can be established by means of the auxiliary power amplifier 6 and the auxiliary feedback circuit. The switches K3 and K4 are turned off so that the output signal of the auxiliary amplifier 6 is not provided to the output terminal of the class-D audio amplifier. When the stage begins, the switches K5 and K6 are turned on so that the output voltage of the class-D audio amplifier is clamped to a predetermined voltage. At the time period, the power amplifier 5 is disabled and has no output signal, which will not influence establishment of the steady state of the control loop.

At the third stage, the switches K3 and K4 are turned on so that the output signal of the auxiliary amplifier 6 is provided to the output terminals OUTP and OUTN of the class-D audio amplifier.

At the fourth stage, the auxiliary close loop consisting of the auxiliary power amplifier 6 and the auxiliary feedback circuit render the class-D audio amplifier loop to operate completely in a steady state. Meanwhile, the power amplifier 5 is enabled. The power amplifier 5 starts to operate when the auxiliary close loop establishes a steady state. The switches K1 and K2 are turned off, and the switches K3 and K4 are turned off, so that the auxiliary power amplifier 6 stops operating in the class-D audio amplifier loop. Meanwhile, the soft start circuit 7 is still in an operating state to ensure that no POP noise occurs at the output terminal of the class-D audio amplifier.

At the fifth stage, the soft start circuit 7 stops operating. The start stage ends, and the class-D audio amplifier begins a normal state.

According to an embodiment of the present disclosure, when the class-D audio amplifier is powered on, the auxiliary power amplifier 6 and the auxiliary feedback circuit constitute an auxiliary close loop so that a control loop is established firstly. Meanwhile, the auxiliary power amplifier provides an output signal which is only fed back but not supplied to an output terminal. Thus, in the process of establishing the control loop, there will be no POP noise at the output terminal of the class-D audio amplifier. After establishing the control loop, the power amplifier 5 is enabled to provide an output, and the auxiliary close loop stop operating in the class-D audio amplifier. In such manner, the soft start circuit 7 is used for preventing the POP noise from being supplied to the output terminal so that there is no POP noise at the output terminal of the class-D audio amplifier when the class-D audio amplifier is powered on.

The foregoing descriptions of specific embodiments of the present invention have been presented, but are not intended to limit the invention to the precise forms disclosed. It will be readily apparent to one skilled in the art that many modifications and changes may be made in the present invention. Any modifications, equivalence, variations of the preferred embodiments can be made without departing from the doctrine and spirit of the present invention.

The invention claimed is:

1. A class-D audio amplifier, comprising:
   a loop filter configured to receive and filter an audio signal and provide a first audio signal;
   a PWM modulation circuit being electrically coupled to said loop filter, and configured to receive said first audio signal and compare said first audio signal with a triangular wave signal and provide an audio PWM signal;
   a power amplifier being electrically coupled to said PWM modulation circuit, and configured to receive and amplify power of said audio PWM signal and provide an output voltage;
   an auxiliary power amplifier configured to start to operate when said class-D audio amplifier is powered on and stops operating after said class-D audio amplifier is powered off; and
   a soft start circuit configured to suppress noise interference from a control loop when said class-D audio amplifier is powered on,
   wherein an output voltage of said power amplifier is not fed back to an input terminal of said loop filter, or said power amplifier is disabled, when said auxiliary power amplifier is active.

2. The class-D audio amplifier according to claim 1, further comprising an auxiliary feedback circuit which connects said auxiliary power amplifier to or disconnects said auxiliary power amplifier from said class-D audio amplifier.

3. The class-D audio amplifier according to claim 2, wherein said auxiliary power amplifier is connected between said input terminal and an output terminal of said loop filter through said auxiliary feedback circuit.

4. The class-D audio amplifier according to claim 3, wherein said auxiliary power amplifier comprises:
   a first comparison circuit configured to receive said first audio signal and compare said first audio signal with a triangular wave signal and provide an auxiliary audio PWM signal;
   a first driving circuit being electrically coupled to said comparison circuit and configured to convert said auxiliary audio PWM signal into an auxiliary driving signal; and
   a first power stage circuit comprising a transistor and configured to operate said transistor in accordance with said auxiliary driving signal.

5. The class-D audio amplifier according to claim 1, wherein said power amplifier comprises:
   a second driving circuit configured to receive and convert said audio PWM signal from said PWM modulation circuit into a driving signal; and
   a second power stage circuit comprising a transistor and configured to operate said transistor to generate said output voltage in accordance with said driving signal.

6. The class-D audio amplifier according to claim 1, wherein said soft start circuit is connected between said loop filter and said PWM modulation circuit,
   said soft start circuit starts to operate before said power amplifier is enabled, and stops operating when an input voltage is equal to said output voltage.

7. The class-D audio amplifier according to claim 6, wherein said soft start circuit has a first input terminal, a second input terminal, a first output terminal and a second output terminal, and comprises:
   a fifth switch being connected in parallel between said first output terminal and said second output terminal,
   a fifth resistor being connected between said first input terminal and said first output terminal;
   a sixth switch having a first terminal being connected to said first output terminal, and a second terminal connected to a first terminal of a third capacitor, and a second terminal of said third capacitor is connected to a ground;
   a sixth resistor being connected between said second input terminal and said second output terminal of said soft start circuit;
   a seventh switch having a first terminal being connected to said second output terminal of said soft start circuit, and a second terminal connected to a first terminal of a fourth capacitor, and a second terminal of said fourth capacitor is connected to a ground,
   wherein said fifth switch is turned on when said power amplifier is enabled, and is turned off after having been turned on for a first predetermined time period, so that said class-D audio amplifier has an original output voltage equal to zero,
   said sixth and said seventh switches are turned on when said class-D audio amplifier is powered on, and are turned off when an input voltage is equal to said output voltage.

8. The class-D audio amplifier according to claim 6, further comprising a feedback circuit which is connected between an output terminal of said class-D audio amplifier and said input terminal of said loop filter, wherein said feedback circuit is turned on when a second predetermined time period elapses after said soft start circuit stops its operation.

9. The class-D audio amplifier according to claim 1, wherein said power amplifier is enabled by a first enable signal, and said auxiliary power amplifier is enabled by a second enable signal.

10. The class-D audio amplifier according to claim 1, wherein said auxiliary power amplifier is connected between said input terminal of said loop filter and an output terminal of said PWM modulation circuit.

11. The class-D audio amplifier according to claim 10, wherein said soft start circuit is disposed between said power amplifier and an output terminal of said class-D audio amplifier, said soft start circuit starts to operate when said class-D audio amplifier is powered on, and stops operating when said auxiliary power amplifier stops operating in said class-D audio amplifier.

12. The class-D audio amplifier according to claim 11, wherein said soft start circuit clamps said output voltage to be a predetermined value during operation.

* * * * *